United States Patent [19]

Wilhelm et al.

[11] Patent Number: 4,737,664
[45] Date of Patent: Apr. 12, 1988

[54] LOGIC GATES REALIZED IN DIFFERENTIAL CASCODE ECL TECHNOLOGY

[75] Inventors: Wilhelm Wilhelm; Karl-Reinhard Schön, both of Munich, Fed. Rep. of Germany

[73] Assignee: Siemens Aktiengesellschaft, Berlin and Munich, Fed. Rep. of Germany

[21] Appl. No.: 779,654

[22] Filed: Sep. 24, 1985

[30] Foreign Application Priority Data

Sep. 24, 1984 [DE] Fed. Rep. of Germany ....... 3435004

[51] Int. Cl.[4] .......................................... H03K 19/086
[52] U.S. Cl. .................................... 307/455; 307/443; 307/454
[58] Field of Search ................ 307/443, 454, 455–456, 307/243, 272 A, 291, 299 A

[56] References Cited

U.S. PATENT DOCUMENTS

| 3,649,844 | 3/1972 | Kroos | 307/455 X |
| 4,386,282 | 5/1983 | Scavuzzo | 307/272 A X |
| 4,394,657 | 7/1983 | Isogai et al. | 307/463 X |
| 4,601,049 | 7/1986 | Wilhelm et al. | 307/272 A X |
| 4,605,871 | 8/1986 | Price et al. | 307/454 X |

FOREIGN PATENT DOCUMENTS 0035326 2/1981 European Pat. Off.
55164889 6/1982 Japan.

Primary Examiner—Stanley D. Miller
Assistant Examiner—D. R. Hudspeth
Attorney, Agent, or Firm—Herbert L. Lerner; Laurence A. Greenberg

[57] ABSTRACT

A semiconductor circuit arrangement in ECL technology for realizing logic conjunctions between more than three input variables includes at least two series-gating stages having at least two ECL current switches controlled by an input variable each and each includes a reference circuit and at least one control circuit, forming logical conjunctions if connected in series and at least one diode for separating the conjunctions from each other by at least one diode threshold voltage, further including a push-pull differential amplifier forming the control circuit of each ECL current switch for forming a logical conjunction between input signals of the push-pull differential amplifier and at least one signal depending on an input variable of another voltage level.

11 Claims, 2 Drawing Sheets

LOGIC GATES REALIZED IN DIFFERENTIAL CASCODE ECL TECHNOLOGY

The present invention relates to the realization of AND conjunctions in emitter-coupled logic (ECL) circuits.

BACKGROUND AND PRIOR ART

ECL logic modules are distinguished by particularly high speed because there is no saturation of the transistors. The principle of the circuits is based on the fact that a constant emitter current is fed to a differential amplifier each having a first and a second transistor and the base of the first of the transistors has a bias between a low and a high level. Depending on the potential of the base of the second transistor, the latter or the first transistor takes over the current which causes at the respectively associated collector resistor a voltage drop determining the output state. AND logic circuits can be realized ver simply by series-gating where several such stages are located one on top of the other, i.e., the collectors of the lowest level plane are always connected to the emitters of the differential stage belonging to the next higher potential plane, and only the topmost plane has collector resistors. In the case of OR gates, the collectors of the topmost potential plane lead to a nodal point and from there to the collector resistor.

The number of input variables in the case of AND conjunctions is limited by the number of possible series-gating stages, the levels of which differ by a diode voltage each. In order to assure a sufficient signal excursion, maximally three stages can be on top of each other, taking into consideration the required current sources with supply voltages of 4.5 to 5.2 V.

According to the state of the art, more than three input variables in an AND gate are realized by connecting in series several series-gating gates, in which respective partial interconnections are carried out. From three input variables an (auxiliary) output signal is generated which addresses an input of the next-following gate. Four input variables, for instance, require three series-gating stages of the first and two stages of the second gate as is shown in FIG. 1 by the example of a circuit of a 4-bit multiplexer with latching.

The logic function belonging to the circuit example of FIG. 1 reads:

$$Q(t) = A.B.C.D1 + \bar{A}.B.C.D3 + \bar{A}.\bar{B}.C.D4 + Q(t-1).\bar{C}$$

The maximally four input variables of the AND gates require two series-connected series-gating gates. The first gate realizes the logic function $M = A.B.D1 + \bar{A}.B.D2 + A.B.D3 + \bar{A}.\bar{B}.D4$ and the second gate, the logic function $Q(t) = M.C. + Q(t-1).\bar{C}$. On the lowest level plane VSI there are constant-current sources I1 to I7 with their emitter resistor RI1 to RI7, supplying the circuit. The two differential amplifiers DA and DC of the lower series-gating stage with the base bias VB3 are controlled by the emitter followers TA and TC and their inputs A and C. The diodes DIA and DIC serve for matching the level to the next-higher stage with a base bias VB2 for differential stages DB1 and DB2, DM and DQ(t−1) which are controlled by the emitter followers TB, TM and T1Q(t−1) with the inputs B and M respectively and, in connection with the series base resistor RE3, by Q. Superimposed on this plane is the third series-gating stage with the differential amplifiers DE1 to DE4 and the inputs D1 to D4. The corresponding bias VB1 is present at the bases of two two-emitter transistors, the collectors of which are tied together and form an OR logic circuit in conjunction with the common collector resistor RE1. Its collector potential controls, via the transistor TM, the input M of the second series-gating gate which is connected in series and the output states Q and $\bar{Q}$ which are present at the collectors of the differential stages DM and DQ(t−1) and their load resistors RE2, RE4 and RE5 and form the output of the circuit.

Disadvantages of this method are the relatively long gate propagation times which depend on the number of the series-gating stages to be traversed and are, for instance, for the circuit according to FIG. 1, typically for the signal Di after Q 1.07 ns, for A after Q 1.33 ns and for B after Q 1.20 ns; the relatively large amount of power required due to the large amount of circuitry; and the frequently not optimal utilization of the series-gating stages.

It is an object of the invention to further increase, by circuitry measures with only two series-gating stages, the number of input variables, and to shorten the signal propagation time.

SUMMARY OF THE INVENTION

According to the invention, this problem is solved in an arrangement which includes a semiconductor circuit arrangement in ECL technology for realizing logic conjunctions between more than three input variables having a number of series-gating stages in which ECL current switches are controlled each by an input variable and each switch contains a reference circuit and at least one control circuit which result in logical conjunctions if connected in series and separated from each other by at least one diode threshold voltage, and wherein a push-pull differential amplifier forming the control circuit of the ECL current switch forms a logical conjunction between input signals of the push-pull differential amplifier and at least one signal which depends on an input variable of another voltage level stage.

In another embodiment the semiconductor circuit arrangement is characterized by the feature that the input variables include addressing signals and/or data signals and their complementary signals.

In still another embodiment the semiconductor circuit arrangement is characterized by the feature that the input variables address the topmost voltage level stage.

In still another embodiment, the semiconductor circuit arrangement is further characterized by the feature that the input variables address the control circuits of series-gating stages via emitter followers.

In still another embodiment, the semiconductor circuit arrangement is further characterized by the feature that a series-gating stage contains at least two ECL current switches each controlled by one input variable.

In still another embodiment, the semiconductor circuit arrangement is further characterized by the feature that at least one control circuit of the ECL current switches contains a transistor and/or a push-pull differential amplifier.

In still another embodiment, the semiconductor circuit arrangement is further characterized by the feature that at least one control circuit and/or a reference circuit of at least two of the ECL current switches of a series-gating stage contains at least one multi-emitter transistor.

In still another embodiment, the semiconductor circuit arrangement is further characterized by the feature that resistors form a logical conjunction between addressing signals and/or data signals and/or signals depending thereon and/or output signals of one or more of the voltage level stage.

In still another embodiment, the semiconductor circuit arrangement is further characterized by the feature that the input signals of the push-pull differential amplifiers are complementary output signals of a series-gating stage.

In still another embodiment, the semiconductor circuit arrangement is further characterized by the feature that the input signals of the push-pull differential amplifiers are formed from the logical conjunction of complementary output signals of a series-gating stage and a signal dependent on an input variable by voltage addition by means of resistors.

In still another embodiment, the semiconductor circuit arrangement is further characterized by the feature that the resistors serve for matching voltage levels internally to the circuit.

Further embodiments of the idea of the invention defined above are characterized in the claims.

Although the invention is illustrated and described herein as embodied in an AND gate for ECL circuits, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
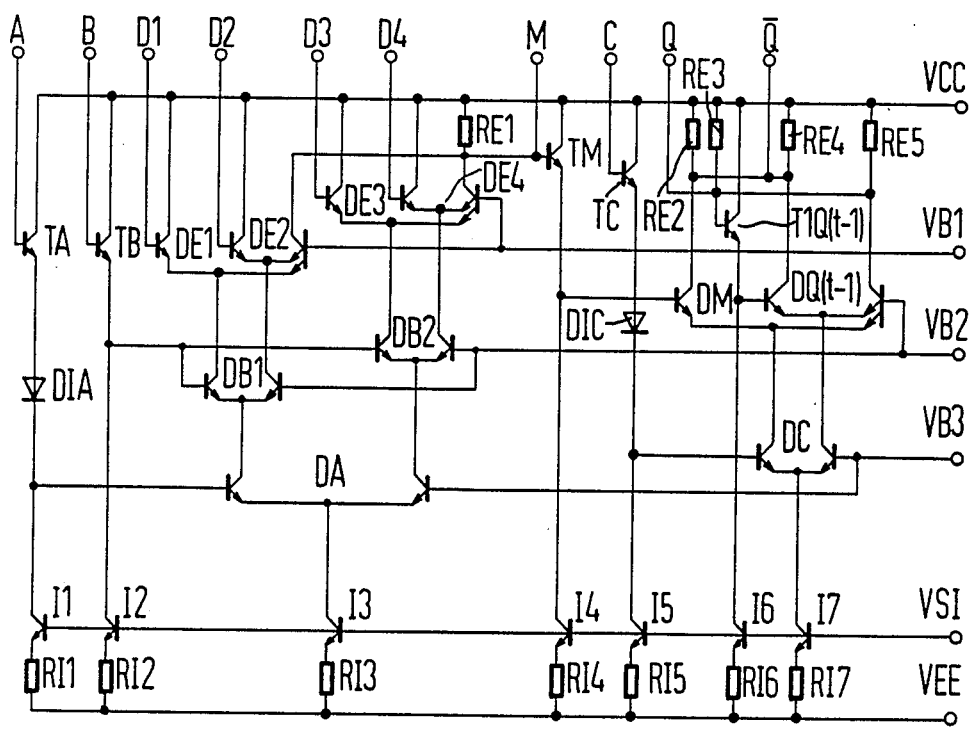
FIG. 1 is an illustrative example of the prior art.
Figure 2:
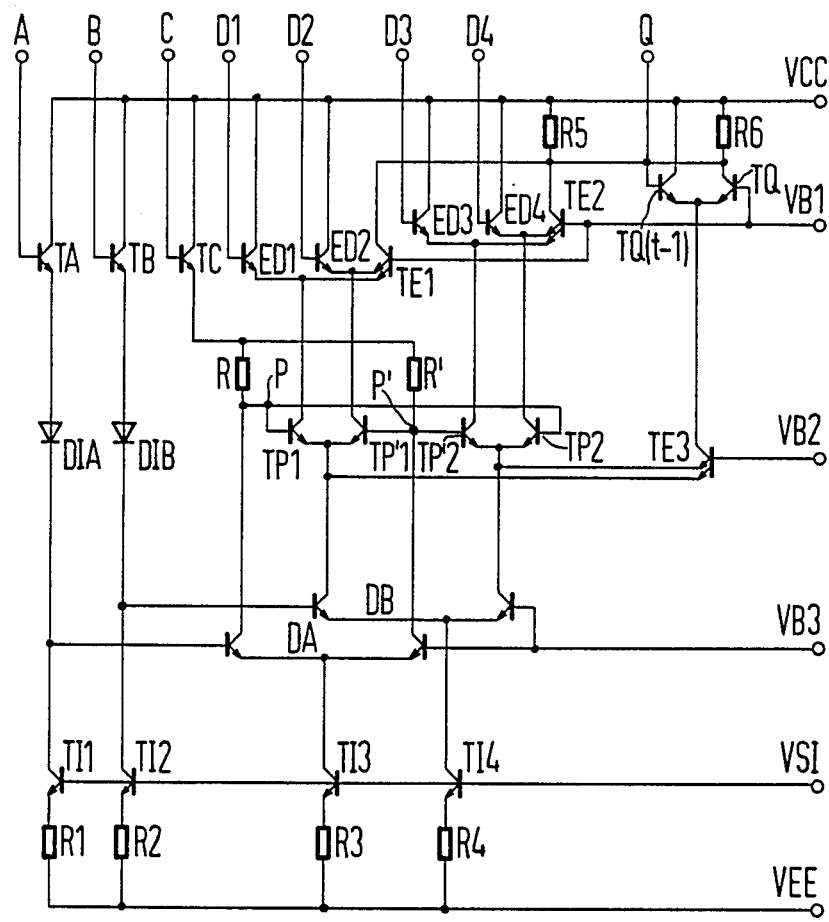
FIG. 2 shows a circuit, corresponding to FIG. 1, of a 4-bit multiplexer with latching if three series-gating stages are available, using the same reference symbols as FIG. 1.

An example of a circuit according to the invention, is shown in FIG. 2, which realizes the same logic function as FIG. 1. The principle of the invention includes the introduction of an additional AND logic circuit between two input signals in such a manner that the selected branch is always at the voltage level determined by one of the signals alone and the additional auxiliary signals are so small that the ECL current switch controlled by the other signal can be one level plane lower without the danger of saturation. These requirements are met, for instance, by a push-pull circuit arranged in the middle level plane.

The circuit according to FIG. 2 is supplied by four current sources which contain transistors TI1 to TI4 respectively addressed by the common base voltage VSI together with the corresponding emitter transistors R1 to R4. These in turn are connected with their other terminal to the terminal VEE of the supply voltage source.

One level plane higher, on the lower series-gating stage, there are the two differential amplifiers DA and DB with the base bias VB3 for each reference circuit which is supplied by the current source transistors TI3 and TI4 and are controlled by the input emitter followers TA and TB arranged at the topmost series-gating stage, and their input signals A and B. For level matching of the two series-gating stages serve the diodes DIA and DIB which follow the emitters of TA and TB and on which the forward current is impressed via the collectors of TI1 and TI2. The cathodes of DIA and DIB are additionally connected to the base terminals of the control transistors of the differential stages DA and DB not biased by VB3.

At the next higher level plane, at the central series-gating stage, the bias VB2 is applied to the base of the two-emitter transistor TE3. The two emitters are connected to the emitters of two differential amplifiers belonging to the same level plane and to the collectors of the differential stage DB. The collector of the control transistor of the DB stage not biased by VB3 is associated with the emitters of TP1 and TP'1, and the other collector is assigned to the emitters of TP2 and TP'2. The common base terminal P of the transistors TP1 and TP2 is controlled via the resistor R by the output of the emitter follower TC with the input signal C and the collector of the control transistor, not biased by VB3, of the differential stage DA. Similarly, the base terminal P' of the transistors TP'1 and TP'2 via R' is likewise connected to the emitter follower TC and to the collector of the transistor, biased by VB3, of the differential stage DA. Point P realizes the conjunction P = $\overline{A}$C; and P' = AC. The additional signal generated at the resistors R and R', respectively, can be made very small because of the push-pull principle, so that the ECL current switch DA controlled by the signal A cannot get into saturation.

The upper series-gating stage contains the ECL current switches which are controlled by the data signals D1 to D4 and are combined in two groups of twos with a two-emitter transistor each, and a latch. The bias VB1 is connected to the bases of the two-emitter transistors TE1 and TE2 as well as the latching transistor TQ. One emitter of TE1 is connected to the emitter of the transistor ED1 controlled by D1 and to the collector of TP1; the other emitter of TE1 is connected to the emitter of the transistor ED2 controlled by D2 and to the collector of TP'1. Similarly, one emitter of TE2 is connected to the emitter of the transistor ED3 controlled by D3 and to the collector of TP'2, and the other emitter of TE2 to the emitter of the transistor ED4 controlled by D4, and to the collector of TP2.

The emitters of the differential amplifier stage of TQ and TQ(t−1) realizing the latch are connected in series with the collector of the two-emitter transistor TE3 which produces the signal $\overline{C}$. The collector of TQ is fed back to the base of TQ(t−1).

While the collectors of the (input) transistors not biased by VB1 in this plane are connected to the pole VCC of the supply voltage source, the collectors of the transistors TE1, TE2 and TQ, combined via the parallel connection of the resistors R5 and R6 to VCC, form the common output Q. The circuit according to FIG. 2 makes possible a reduction of the propagation times from Di to Q by about 35%, from A to Q by about 10%, and from B to Q by about 25%, as compared with a circuit realizing the same logic function according to FIG. 1 with two series-connected series-gating gates. At the same time the required power loss is reduced by more than 35% in the circuit according to FIG. 2 as per the invention.

The foregoing is a description corresponding in substance to German Application P 34 35 004.7, filed Sept. 24, 1984, the International priority of which is being claimed for the instant application, and which is hereby made part of this application. Any material discrepancies between the foregoing specification and the aforementioned corresponding German application are to be resolved in favor of the latter.

We claim:

1. Semiconductor circuit in ECL technology for realizing logic functions of more than three input variables, comprising at least two series-gating stages each having at least two ECL current switches, each switch being controlled by a respective input variable; each switch including a reference circuit and at least one control circuit, the stages being connected in series, forming logic gates; at least one diode connected between said stages for separating the stages from each other by at least one diode threshold voltage; a differential amplifier forming the control circuit for each ECL current switch, at least one of said differential amplifiers having two transistors, each having its gate connected through a respective resistor thorugh a common emitter follower to supply potential, the logic function being formed of input variables of the differential amplifier and at least one signal depending on an input variable of another stage.

2. Semiconductor circuit according to claim 1, wherein the input variables comprise addressing signals and data signals and their complementary signals.

3. Semiconductor circuit according to claim 1, wherein the input variables are arranged at the highest bias level.

4. Semiconductor circuit according to claim 2 including at least one emitter follower and wherein a respective one of the input variables engage the control circuit of a respective one of the series-gating stages via said emitter follower.

5. Semiconductor circuit arrangement according to claim 1 including at least two ECL current switches included in the series-gating stage and wherein each current switch is controlled by the respective input variable.

6. Semiconductor circuit according to claim 4, including a plurality of said emitter followers and of said differential amplifiers.

7. Semiconductor circuit according to claim 6, including at least one multi-emitter transistor in at least one of the control circuit and the reference circuit of said ECL current switches.

8. Semiconductor circuit according to claim 1, wherein at least one of said resistors forms a logic function of at last three of said more than three input variables of a respective bias level.

9. Semiconductor circuit according to claim 1, wherein the input variables of the differential amplifier form complementary output signals of the respective series-gating stage.

10. Semiconductor circuit according to claim 9 wherein the input signals of the differential amplifier are formed as a logic function of the complementary output signals of a series-gating stage and a signal dependent on an input variable by voltage drop across said resistor.

11. Semiconductor circuit according to claim 1 wherein said resistors provide for voltage level matching of the series gating stages.

* * * * *